US008566772B2

(12) United States Patent
Bulusu et al.

(10) Patent No.: US 8,566,772 B2
(45) Date of Patent: Oct. 22, 2013

(54) METHOD, COMPUTER PROGRAM AND COMPUTING SYSTEM FOR OPTIMIZING AN ARCHITECTURAL MODEL OF A MICROPROCESSOR

(75) Inventors: Gopi Kumar Bulusu, Vasakhapatnam (IN); Murali Desikan, Chennai (IN)

(73) Assignee: Sankhya Technologies Private Limited, Tamil Nadu (IN)

( * ) Notice: Subject to any disclaimer, the term of this patent is extended or adjusted under 35 U.S.C. 154(b) by 0 days.

(21) Appl. No.: 13/595,594

(22) Filed: Aug. 27, 2012

(65) Prior Publication Data

US 2013/0074030 A1     Mar. 21, 2013

Related U.S. Application Data

(63) Continuation-in-part of application No. 12/805,286, filed on Jul. 22, 2010, now abandoned.

(51) Int. Cl.
*G06F 17/50* (2006.01)

(52) U.S. Cl.
USPC .......................................... 716/132

(58) Field of Classification Search
USPC ..................... 716/104, 132, 133, 134, 135
See application file for complete search history.

(56) References Cited

U.S. PATENT DOCUMENTS

| 6,918,111 | B1 | 7/2005 | Damron et al. |
| 2003/0084061 | A1* | 5/2003 | Clewis et al. ............... 707/102 |
| 2003/0105617 | A1* | 6/2003 | Cadambi et al. ............ 703/14 |
| 2010/0153923 | A1 | 6/2010 | Kawahito |
| 2010/0275188 | A1 | 10/2010 | Dubinsky et al. |

* cited by examiner

*Primary Examiner* — Vuthe Siek
(74) *Attorney, Agent, or Firm* — Rader, Fishman & Grauer PLLC

(57) ABSTRACT

A computer program for optimizing an architectural model of a microprocessor by configuring elements of the instruction set as nodes of the graph. The architectural model of a microprocessor represents an instruction set of the microprocessor. Determination is made whether nodes with identical bit position and value encoding are in the graph. If nodes with the identical bit position and value encoding are present, a path from a source node to a target node is separated into a common node for each node in the graph. The common node is reused to optimize common paths from the graph and the source node is directly connected to the common node in the graph using a forward edge. A back-edge is added from the common node to the source node through the target node and the above steps are recursively repeated until all nodes of the graph are processed.

9 Claims, 10 Drawing Sheets

METHOD, COMPUTER PROGRAM AND COMPUTING SYSTEM FOR OPTIMIZING AN ARCHITECTURAL MODEL OF A MICROPROCESSOR

This is a continuation-in-part of application of Ser. No. 12/805,286, filed Jul. 22, 2011. The present application claims priority based on Indian Patent Application No. 1769/CHE/2009, filed Jul. 27, 2009, the entirety of which being incorporated herein by reference.

FIELD OF THE INVENTION

The present invention relates to the field of microprocessor architectural modeling and design. The present invention specifically relates to a method, computer program and computing system for optimizing an architectural model of a microprocessor.

BACKGROUND OF THE INVENTION

Architecture Description Languages (ADL) are used to describe the architecture of a microprocessor. An ADL description of a processor is typically utilized for designing the processor, software/hardware based verification of the processor behavior, generation of compiler tool-chain for the processor and for creating a hardware description of the processor. An ADL description describes instructions, operands, addressing modes, functional units and registers of the microprocessor. An ADL description also captures the behavior of the processor, either embedded in the processor description itself or as external functions.

Typically, an ADL captures the information about the processor in a hierarchical fashion, where instruction-groups (also called as 'bundles') are specified at the top-level of the hierarchy. Each bundle refers to one or more instructions, and each instruction refers to one or more operands and constant values. Similarly, each operand can contain one or more constant value or refer to other operands. Using an ADL, similar instructions, operands and bundles can be grouped together to create a more compact representation of the instruction set of the processor. Such compact representation of the instruction set is also less prone to errors because duplication of information is avoided. Also, various programming tools for the processor can be automatically generated from an ADL description of the microprocessor.

Furthermore, in order to process the ADL description of the microprocessor in a computer environment, it is necessary to parse the description and create an internal representation of the information contained in the description. The obvious way to represent this information is a tree with instruction groups (bundles) at the root, instructions at the internal nodes and operands, and constant values at the leaf of the tree. Then, a decoder for the instruction set can be constructed to traverse the hierarchy starting from the root node and visit the nodes, matching the corresponding bits at each node.

The problem with the above conventional hierarchical representation of the instruction set architecture is that it involves duplication of nodes when the same operand or constant value is referenced by many instructions or instruction groups in the architecture. Moreover, when decoding a machine instruction using the hierarchical description, the same nodes may have to be compared many times with the input, which results in increased number of comparisons when implemented in software. Such large number of comparisons in software requires similar number of comparators to be implemented in hardware. Therefore, it is desirable to provide a method, computer program and computing system for optimizing an architectural model of a microprocessor, which leads to efficient decoding of the machine code for the microprocessor. Also, such optimized architectural model results in a hardware circuit that is smaller in size and consumes lesser power when the model is transformed into hardware for the microprocessor.

OBJECT OF THE INVENTION

An object of the present invention is to provide a method, computer program and computing system for optimizing an architectural model of a microprocessor, which achieves efficient decoding of the machine code for the microprocessor.

An object of the present invention is to provide a method, computer program and computing system for optimizing an architectural model of a microprocessor, which results in a hardware that is smaller in size and consumes lesser power when the microprocessor is realized in hardware.

SUMMARY OF THE INVENTION

According to one aspect, the present invention, which achieves this objective, relates to a method, computer program and computing system for optimizing an architectural model of a microprocessor, comprising: representing an instruction set of the microprocessor as a graph by representing the elements of the instruction set as nodes of the graph. Determination is made whether the nodes with identical bit position and value encoding is present in the graph. If the nodes with the identical bit position and value encoding are present, a path from a source node to a target node is separated into a common node for each node in the graph. The common node is reused to optimize common paths out of the graph and the source node is directly connected to the common node in the graph using a forward edge. A back-edge is added from the common node to the source node through the target node and the above steps are recursively repeated until all the nodes of the graph are processed. Thus, the method, computer program and computing system reduce the required number of comparisons due to the common path optimization, which results in efficient decoding of the machine code for the microprocessor.

Furthermore, the elements of the instruction set are defined as instruction groups, instructions and operands. The forward edge is connected from the source node to the target node in the directed graph if there is a reference from the element (bundle, instruction or operand) corresponding to the source node to the element corresponding to the target node in the instruction set. Such forward edge is labeled with the bit position and value where the element corresponding to the target node is encoded in the element corresponding to the source node. Similarly, the back-edge is introduced from all target nodes to their corresponding source nodes and labeled with a Boolean value (0 or 1). Initially, all back-edges are labeled with zero. The back-edge ending in a node is called as an input back-edge whereas the back-edge originating from a node is called an output back-edge.

In addition, the node corresponding to the top-level element in the instruction set contains no output back-edges and one or more input back-edges. The node corresponding to a leaf element in the instruction set hierarchy contains no input back-edges and one or more output back-edges, where other nodes contains one or more input and output back-edges. The label on the output back-edge of the node is changed from 0 to 1 when all its input back-edges are labeled with 1. The nodes corresponding to the elements present at the leaf level in the instruction set hierarchy are reused in the graph instead of creating a new node for each reference to them. Each node representing the leaf element includes a comparator to compare input bits with the values represented by the node. The output value of the comparator is set to the back-edge corresponding to the bit position of the input. Similarly, each node corresponding to the non-leaf element of the instruction set logically ANDs all its input back-edges and the result of the logical AND is set as the output back-edges of the node.

When decoding the instruction of the processor, a machine code of specified number of bits is passed to the node corresponding to the top-level element in the instruction set. Then, these bits are propagated through the graph to all nodes connected to the top-level node, with each node obtaining a specified number of bits corresponding to the bit position where it is encoded. When a part of the machine instruction is matched by a node corresponding to the leaf element in the instruction set, it sets all its output back-edges to 1. The nodes at the target of these output back-edges receive the information and propagate it through their back-edges resulting in a path being selected from the nodes corresponding to the leaf elements to the top-level element, thereby decoding the input machine instruction. If no match occurs at any node corresponding to the leaf element of the instruction set or only a partial match occurs with the input machine code, then a path to the top-level node along the back-edges is not available, which indicates that the input machine code is not a valid machine instruction for the processor under consideration.

Moreover, the graph is optimized by separating each path passing from a parent node to a child node into a common node for each node in the graph, with incoming edge from the parent node and outgoing edge to the child node. Due to the common-path optimization and the presence of back-edges, the number of comparisons required to match instructions is reduced, which results in efficient decoding of instructions. This optimization also reduces the number of data paths and comparators when the architecture of the processor is realized in hardware, which results in a hardware circuit of a smaller size that consumes lesser power.

BRIEF DESCRIPTION OF THE DRAWINGS

The invention will be discussed in greater detail with reference to the accompanying Figures.

DETAILED DESCRIPTION OF THE INVENTION

Figure 1:
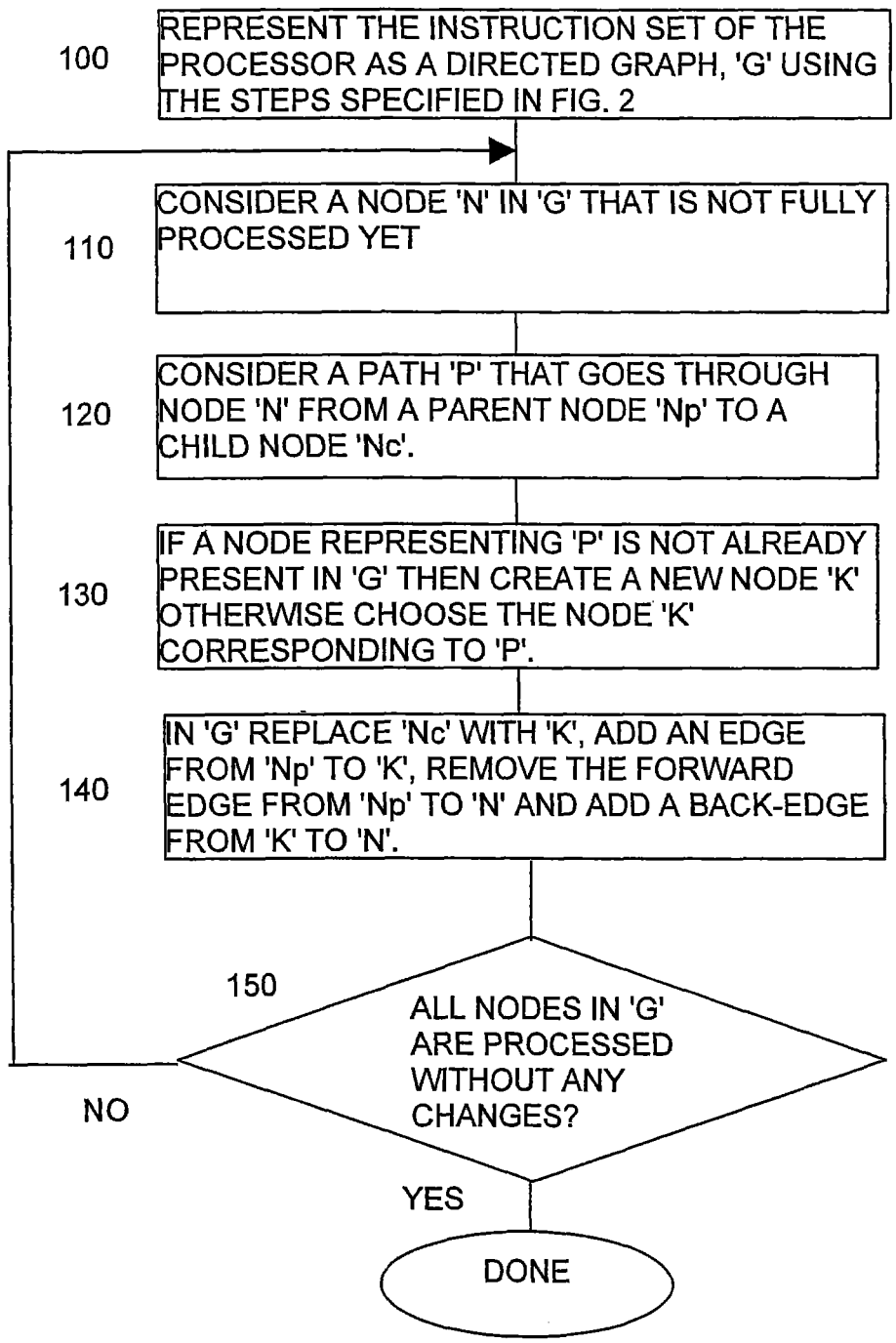
FIG. 1 shows a flow diagram of the steps of a method for optimizing an instruction set architectural model of a microprocessor, in accordance with an exemplary embodiment of the present invention.
Figure 2:
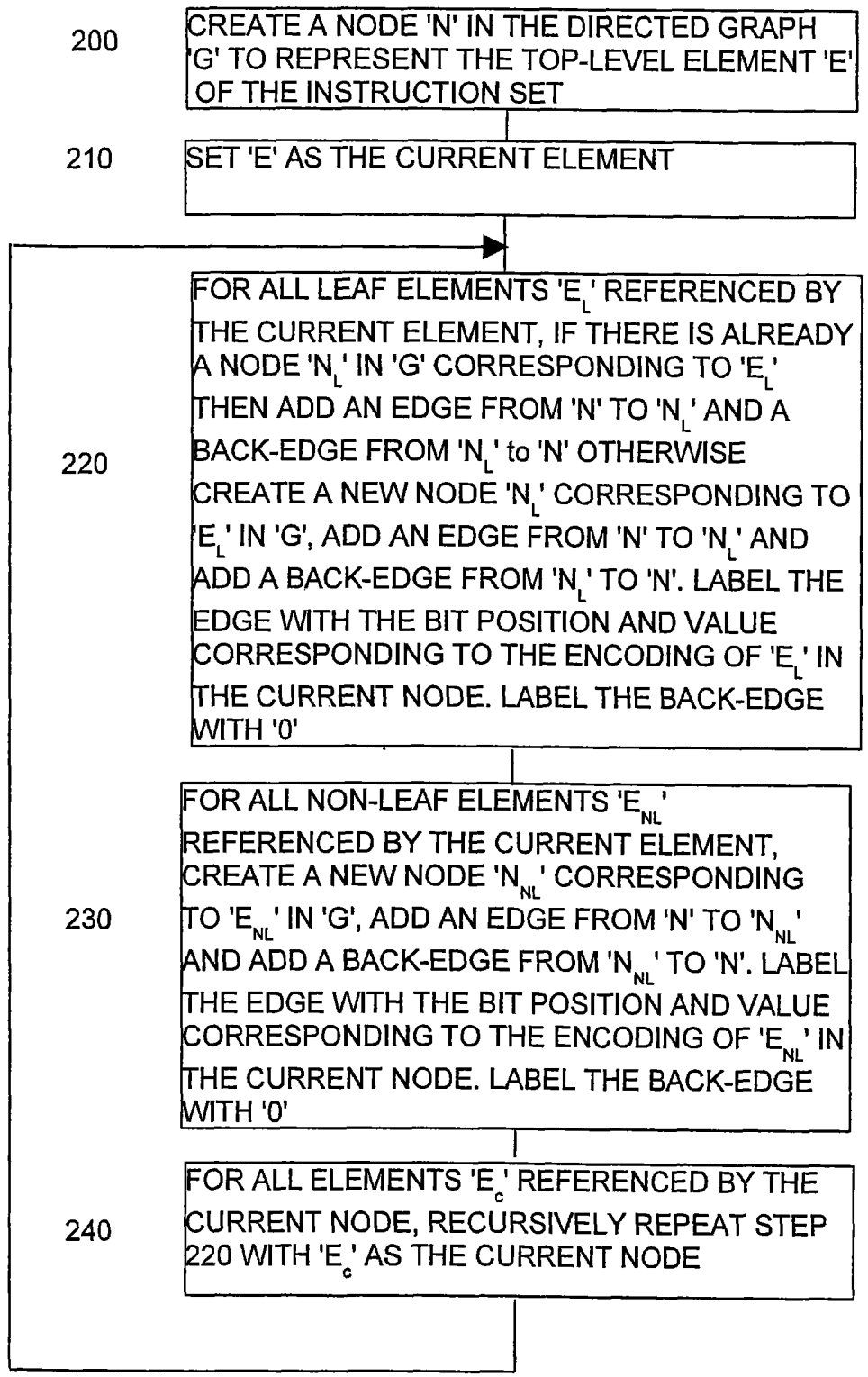
FIG. 2 illustrates a flow diagram of the steps of constructing a directed graph of the elements of the instruction set of the microprocessor, in accordance with an exemplary embodiment of the present invention.

Referring to FIG. 1, a flow diagram of the steps of a method for optimizing an instruction set architectural model of a microprocessor is illustrated, in accordance with an exemplary embodiment of the present invention. In step 100, the instruction set of the microprocessor is converted into a directed graph 'G' according to the steps of FIG. 2, which illustrates a flow diagram of the steps of constructing a directed graph of the elements of the instruction set of the microprocessor, in accordance with an exemplary embodiment of the present invention. In step 200, a node 'N' corresponding to the top-level element 'E' in the instruction set hierarchy is created in the graph 'G'.

In step 210, the element 'E' is set as the current element considered for processing. As shown in step 220, each leaf element 'EL', i.e. a child of the element 'E' is considered. If a node 'NL' in the graph 'G' corresponding to the leaf element 'EL' is already exists, then a forward edge is added from the node 'N' to the node 'NL'. This forward edge is labeled with the bit position and value corresponding to the encoding of leaf element 'EL' in the current element. Similarly, a back-edge is added from the node 'NL' to the node 'N'. If there is no node in the graph 'G' corresponding to the leaf element 'EL', then a new node 'NL' is created in the graph 'G'. Moreover, a forward edge from the node 'N' to the node 'NL' and a back-edge from the node 'NL' to the node 'N' are added.

In step 230, each non-leaf element 'ENL' of the current element being processed is considered. A new node, 'NNL' is created in the graph 'G' corresponding to the non-leaf element 'ENL'. A forward edge is added in the graph 'G' from the node 'N' to the node 'NNL', where the forward edge is labeled with the bit position and value corresponding to the encoding of non-leaf element 'ENL' in the current element. Similarly, a back-edge is added from the node 'NNL' to the node 'N'. In step 240, all the child elements 'Ec' of the current element are processed by recursively repeating step 220. The complete graph of the instruction set is created when all the elements in the instruction set hierarchy are processed.

Returning to step 110 in FIG. 1, an unprocessed node 'N' of the directed graph 'G' is considered. In step 120, a path 'P' from a parent node 'Np' to another child node 'Nc' through the node 'N' is considered. In step 130, checking is made whether a node 'K' with the same bit position and value encoding is already present in the graph 'G' or not. If it is not present, then a new node 'K' is created in the graph 'G'. Thereafter, in step 140, the child node 'Nc' is replaced with the node 'K'. A forward edge is added from the node 'Np' to the node 'K', whereas the forward edge from the node 'NP' to the node 'N' is removed. So, the node 'NP' is directly connected to the node 'K' in the forward direction and through 'N' as part of the back-edges. In step 150, checking is made whether all nodes in the graph 'G' are processed without any new changes to the graph 'G'. If there are any changes in the graph 'G', then the processing can be repeated from step 110. Similarly, the processing can be terminated when there are no more changes to the graph 'G' since the previous iteration.

Figure 3:
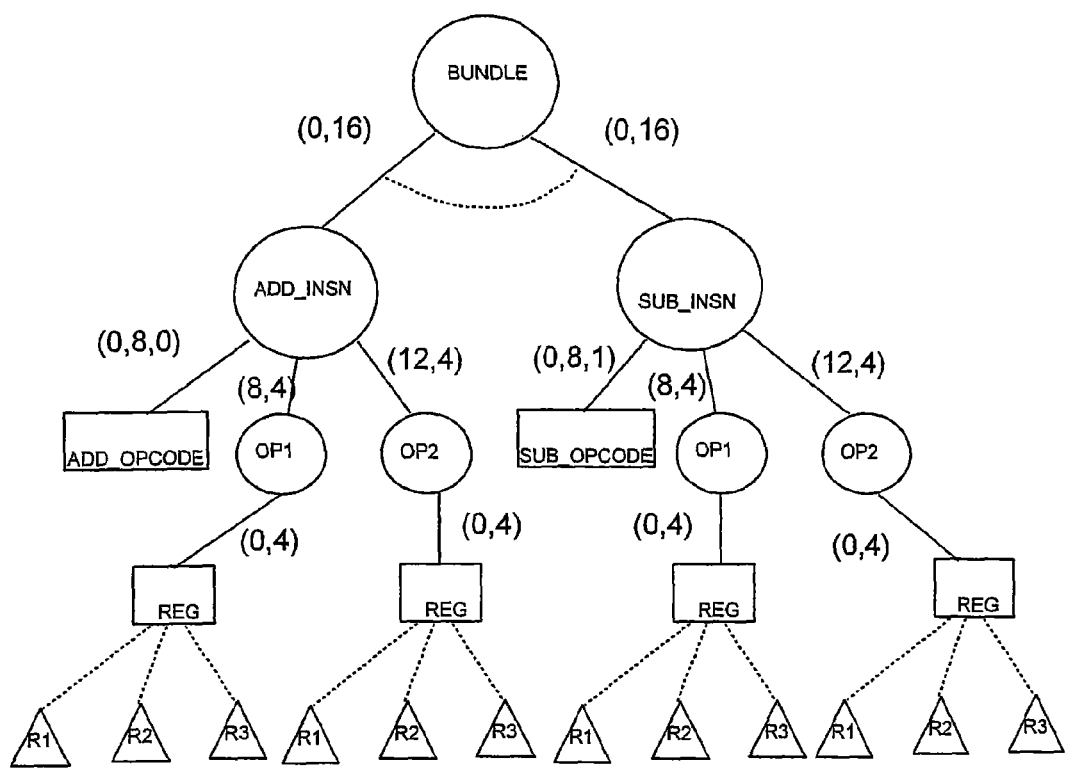
FIG. 3 illustrates an exemplary hierarchical representation of the instruction set of the microprocessor with a bundle and two instructions, in accordance with an exemplary embodiment of the present invention.

Referring to FIG. 3, an exemplary hierarchical representation of the instruction set of the microprocessor with a bundle and two instructions is illustrated, in accordance with an exemplary embodiment of the present invention. In this hierarchical representation, the instruction set of the microprocessor can be represented with the bundle and two instructions, namely ADD_INSN and SUB_INSN. Each instruction contains an operation code (ADD_OPCODE and SUB_OPCODE) and two register operands (OP1, OP2). The operation codes ADD_OPCODE and SUB_OPCODE are encoded at identical positions in the ADD and SUB instructions, respectively.

Similarly, the two operands OP1 and OP2 are encoded at identical positions in both the instructions. The operands OP1 and OP2 are of type REG, which refers to the three registers of the processor, i.e. R1, R2 and R3. The bit positions, where an element is encoded in the machine instruction, are indicated by labeling an edge using a start bit position, the number of bits and an optional value. For example, the edge from the bundle to the instruction ADD_INSN is labeled using (0,16), which indicates that the instruction ADD_INSN is encoded starting at bit 0 for 16 bits in the instruction word. As another example, the edge from the instruction ADD_INSN to the operation code ADD_OPCODE is labeled as (0,8,0), which indicates that the operation code ADD_OPCODE with value 0 is encoded at bit 0 for 8 bits.

Figure 4:
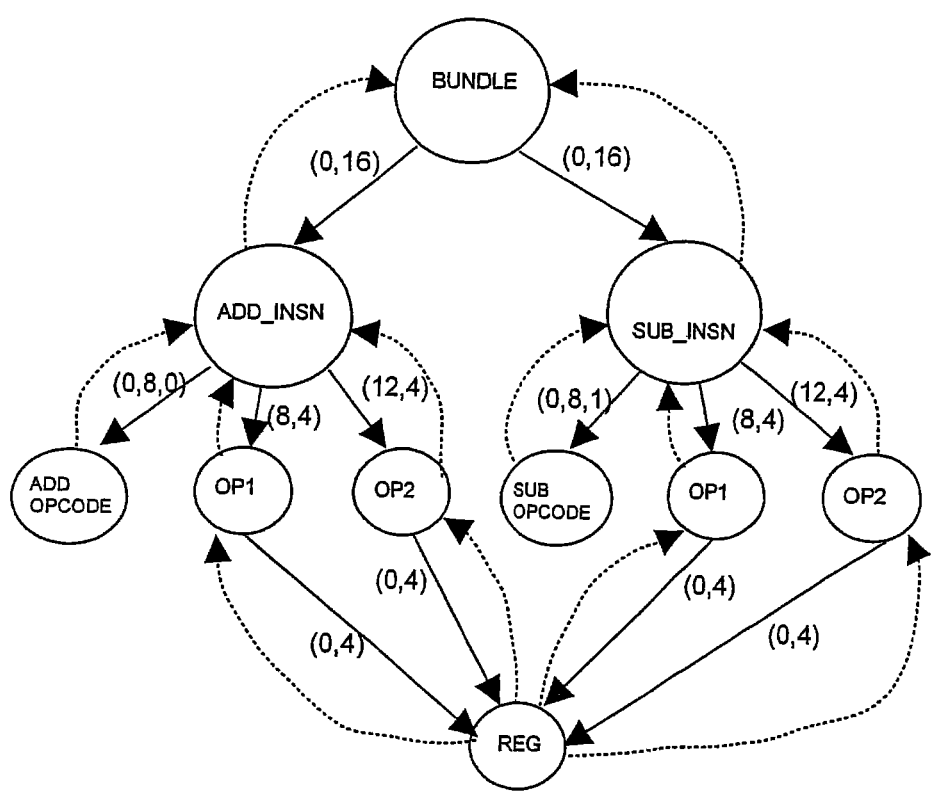
FIG. 4 illustrates an initial directed graph of the instruction set of the microprocessor as shown in FIG. 3, in accordance with an exemplary embodiment of the present invention.
Figure 5:
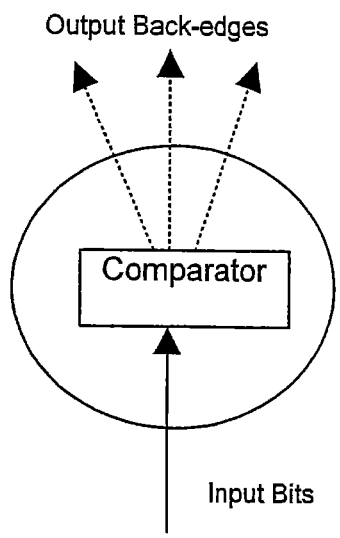
FIG. 5 illustrates a graph node corresponding to a leaf node of the instruction set of the microprocessor, in accordance with an exemplary embodiment of the present invention.

FIG. 4 illustrates an initial directed graph of the instruction set of the microprocessor as shown in FIG. 3, in accordance with an exemplary embodiment of the present invention. In the initial directed graph, the nodes corresponding to OP1 and OP2 are connected by forward edges to a single node corresponding to REG, and there is a back-edge from REG node to OP1 and REG to OP2 (the back-edges are represented with dotted lines). FIG. 5 illustrates a graph node corresponding to a leaf node of the instruction set of the microprocessor, in accordance with an exemplary embodiment of the present invention. Here, this node contains a comparator that matches input bits with the values that the node can carry. The comparator outputs '1' if the input bits match any of the values and outputs 'zero' if the input bits are not matched with any of the values of the node. The output of the comparator is set to the back-edges of the node in such a way that each back-edge is set if the corresponding bits in the input match with the node's value.

Figure 6:
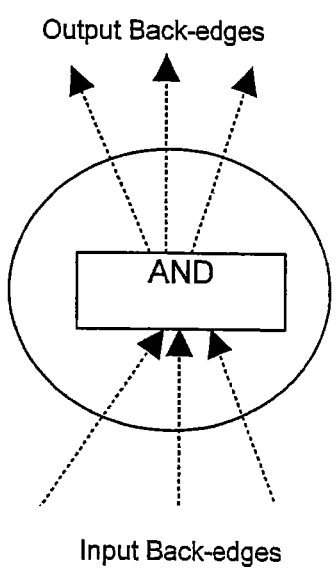
FIG. 6 illustrates a graph node corresponding to a non-leaf node of the instruction set of the microprocessor, in accordance with an exemplary embodiment of the present invention.
Figure 7:
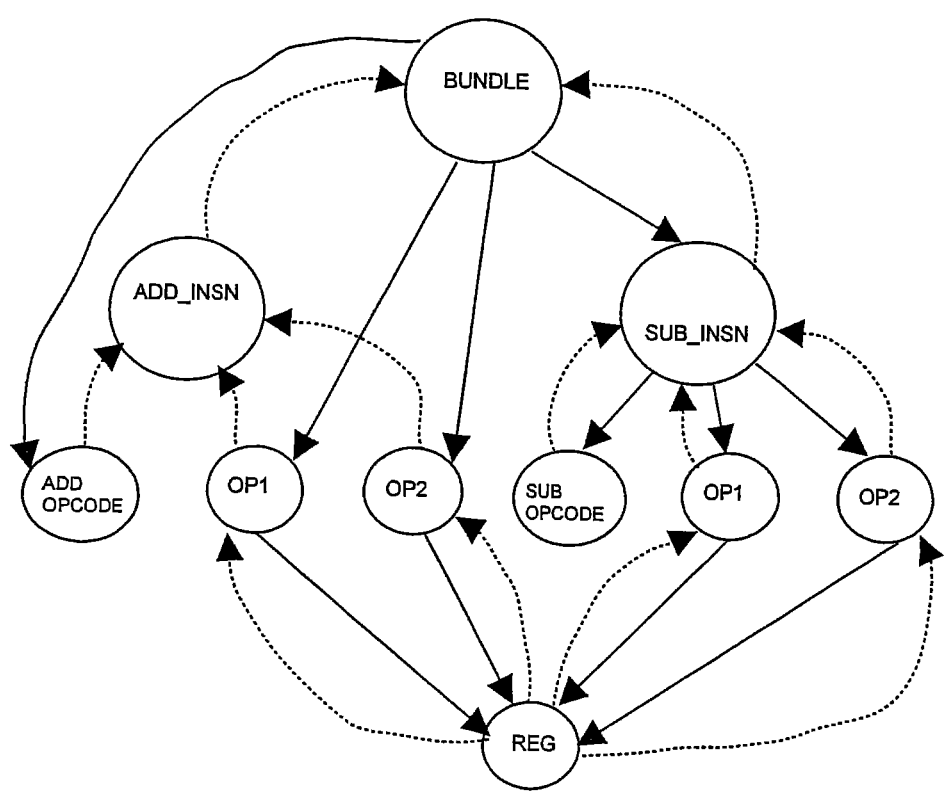
FIG. 7 illustrates the directed graph of the instruction set of FIG. 4 after initial optimization is applied to an ADD_INSN node, in accordance with an exemplary embodiment of the present invention.

Referring to FIG. 6, a graph node corresponding to a non-leaf node of the instruction set of the microprocessor is illustrated, in accordance with an exemplary embodiment of the present invention. Here, the values of the input back-edges are logically ANDed together and the result is set to the output back-edges. FIG. 7 illustrates the directed graph of the instruction set of FIG. 4 after initial optimization is applied to an ADD_INSN node, in accordance with an exemplary embodiment of the present invention. Here, the forward edges from the instruction ADD_INSN to the operation code ADD_OPCODE and the operands OP1 and OP2 are removed and replaced by a direct edge from the BUNDLE node. Therefore, for each node 'N' in the graph, each path traveling from a parent-node 'Np' to a child node 'Nc' is separated into a common node, with incoming edge from the node 'Np' and out-going edge to the node 'N'. Thus, the common paths are optimized out of the graph by reusing common nodes.

Figure 8:
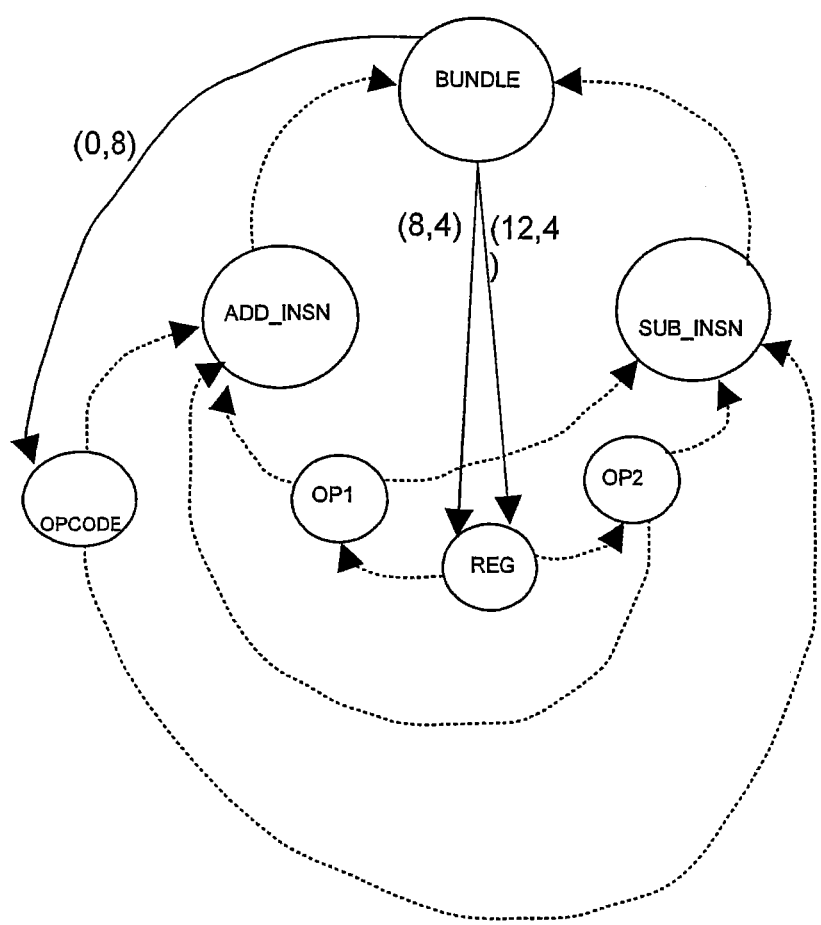
FIG. 8 illustrates a final optimized version of the directed graph of the instruction set of FIG. 4, in accordance with an exemplary embodiment of the present invention.

FIG. 8 illustrates a final optimized version of the directed graph of the instruction set of FIG. 4, in accordance with an exemplary embodiment of the present invention. The graph is optimized by replacing the BUNDLE→OP1→REG path with a direct edge from BUNDLE to the register REG. Similarly, the BUNDLE→OP2→REG path is replaced with a direct edge from BUNDLE to the register REG. While processing the BUNDLE→ADD_INSN→OP1→REG path or the BUNDLE→ADD_INSN→OP2→REG path, checking is made if an identical path already exists. Since BUNDLE→REG path exists, the BUNDLE→ADD_INSN→OP1→REG path or the BUNDLE→ADD_INSN→OP2→REG path is removed and a back-edge is added from the operands OP1 and OP2 to the instruction ADD_INSN. Likewise, while processing the BUNDLE→SUB_INSN→OP1→REG path or the BUNDLE→SUB_INSN→OP2→REG path, checking is made if an identical path already exists. Since BUNDLE→REG path exists, the BUNDLE→SUB_INSN→OP1→REG path or the BUNDLE→SUB_INSN→OP2→REG path is removed and a back-edge is added from the operands OP1 and OP2 to the instruction SUB_INSN.

Figure 9:
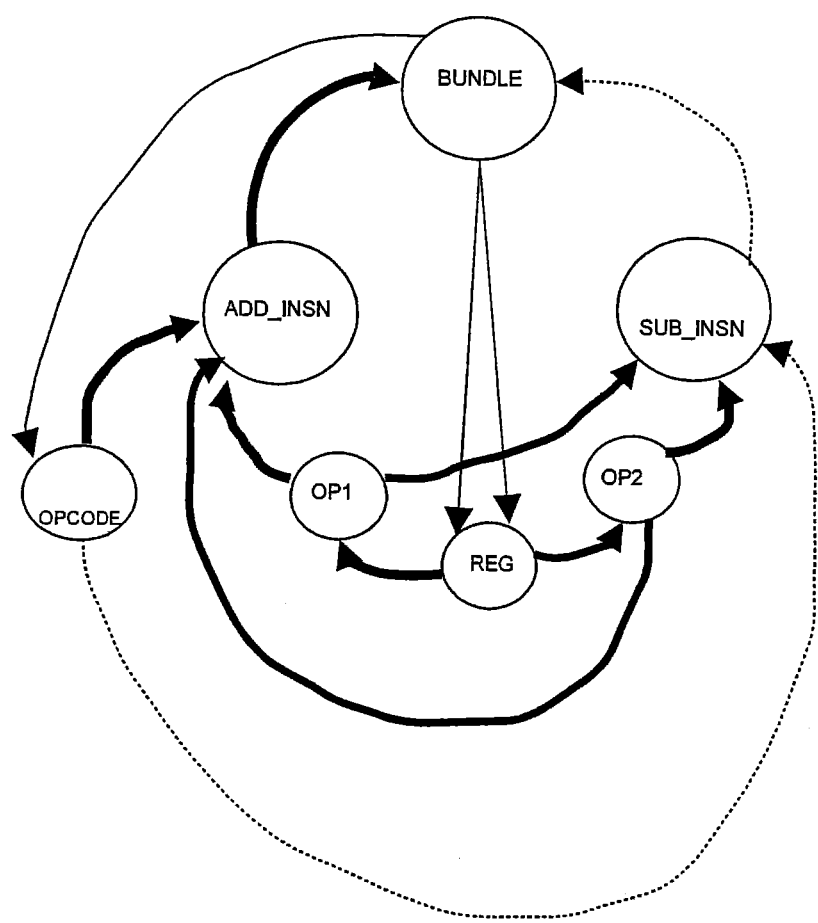
FIG. 9 illustrates a state of the directed graph of the instruction set of FIG. 4 when decoding an ADD instruction of the microprocessor, in accordance with an exemplary embodiment of the present invention.

FIG. 9 illustrates a state of the directed graph of the instruction set of FIG. 4 when decoding an ADD instruction of the microprocessor, in accordance with an exemplary embodiment of the present invention. The back-edges from a node, at which a part of the machine instruction matches, are shown in bold. Let us consider the instruction is ADD R1, R3. Note that the operands OP1 and OP2 matching with the respective registers R1 and R3 are propagated to both ADD and SUB instructions. However, since only the operation code OPCODE of the instruction ADD matches with the given instruction, only the back-edge from the instruction ADD_INSN to the bundle is enabled, which indicates that the input instruction is an ADD instruction.

Furthermore, the 16 bits corresponding to this instruction are passed to the BUNDLE node. Then, the bits corresponding to the operation code OPCODE of the instruction (i.e., bits 0 to 7) are passed from the BUNDLE node to the OPCODE node, which is matched with the opcode values in the node. Since this opcode values matches with operation code OPCODE of the ADD instruction (i.e., zero), the back-edge from the node to the instruction ADD_INSN is set to 1. Thereafter, the bits corresponding to the first register (i.e., bits 8 to 11) are passed from the BUNDLE node to the REG node. The REG node compares the input value with the possible values that it may carry, which matches with the register R1 and thus, the back-edge from the register REG to the operand OP1 is set to 1. This in turn causes the back-edge from the operand OP1 to the instruction ADD_INSN and the operand OP1 to the instruction SUB_INSN to be set to 1.

Similarly, the bits corresponding to the second register (i.e., bits 12 to 15) are then compared with the REG node, which matches with the value for R3 and thus, the back-edge from the register REG to the operand OP2 is set to 1. This causes the back-edges from the operand OP2 to the instruction ADD_INSN and the operand OP2 to the instruction SUB_INSN to be set to 1. In this example, all the input back-edges of the instruction ADD_INSN are set to 1. This causes the output back-edge from the instruction ADD_INSN to BUNDLE to be set to 1, which indicates that the instruction ADD_INSN is matched. Even though, the input back-edges from the operands OP1 and OP2 to the instruction SUB_INSN are set to 1, since the back-edge from the operation code OPCODE is set to zero, the output back-edge from the instruction SUB_INSN to BUNDLE is set to zero, which indicates that the instruction SUB_INSN is not matched with the input machine code.

Figure 10:
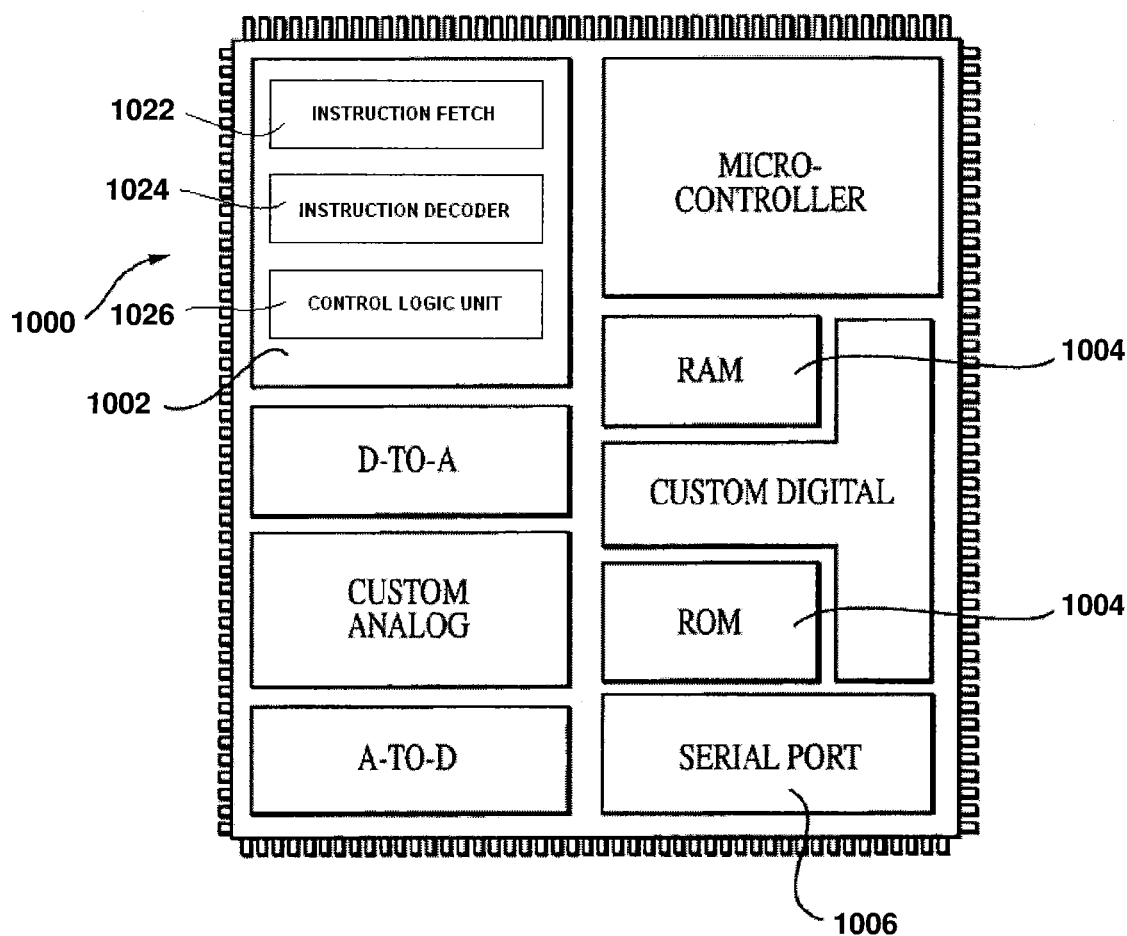
FIG. 10 illustrates a schematic block diagram of a microprocessor design incorporating the optimized architecture model, in accordance with the exemplary embodiment of the present invention.

FIG. 10 illustrates a schematic block diagram of a microprocessor design incorporating the optimized architecture model, in accordance with the exemplary embodiment of the present invention. The microprocessor 1000 is composed of a processor core 1002, an on-chip memory 1004 (including program memory), and an external interface 1006. The microprocessor 1000 is fabricated using the customized design obtained using the computer program of the present invention, which is subsequently synthesized into a logic level representation, and then reduced to a physical device using compilation, layout and fabrication techniques well known in the semiconductor arts. In particular, the method as previously described herein and illustrated in FIGS. 1-9 can readily be implemented into the microprocessor 1000.

The processor core 1002 is embedded with an instruction fetch 1022, an instruction decoder 1024, and a control logic unit 1026 associated therewith. The instruction fetch 1022 is adapted to perform retrieval operation of the instruction set of the method previously describing the optimization of the architectural model of the microprocessor, from the memory 1004, where the instruction set of the previously described method is stored in the memory 1004 accessible by the processor core 1002. The retrieved instruction set of the previously described method is traversed by the instruction decoder 1024, so that the control logic unit 1026 is operative to facilitate execution of the instruction set of the previously described method.

It will be appreciated by one skilled in the art that the microprocessor 1000 may contain any commonly available peripheral such as serial communications devices, parallel ports, timers, counters, high current drivers, analog to digital (A/D) converters, digital to analog converters (D/A), interrupt processors, LCD drivers, memories and other similar devices. Further, the processor 1000 may also include custom or application specific circuitry.

Figure 11:
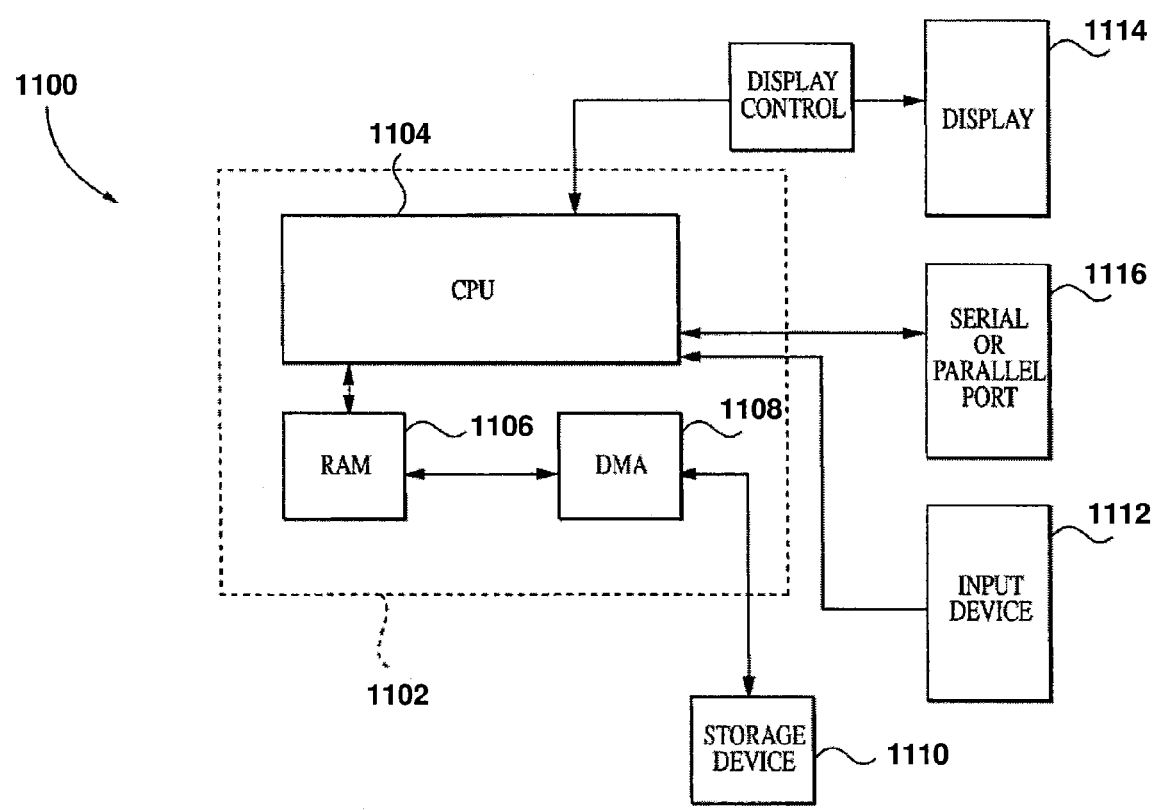
FIG. 11 illustrates a simplified block diagram of an exemplary hardware implementation of a computing system 1100, constructed and operative for synthesizing a microprocessor design incorporating the optimized architecture model, in accordance with an exemplary embodiment of the present invention.

FIG. 11 illustrates a simplified block diagram of an exemplary hardware implementation of a computing system 1100, constructed and operative for synthesizing a microprocessor design incorporating the optimized architecture model, in accordance with an exemplary embodiment of the present invention. The computing system 1100 capable of synthesizing the microprocessor design using the methodology of microprocessor's architecture model optimization discussed with respect to FIGS. 1-9, is described herein. The computing device 1100 comprises a motherboard 1102 having a central processing unit (CPU) 1104, random access memory (RAM) 1106, and a memory controller 1108. A storage device 1110 (such as a hard disk drive or CD-ROM), input device 1112 (such as a keyboard or mouse), and display device 1114 (such as a CRT, plasma, or TFT display), as well as buses necessary to support the operation of the host and peripheral components, are also provided. The aforementioned descriptions and synthesis design for implementation of the method for optimizing the architectural model of the microprocessor 1000, are stored in the form of an object code representation of a computer program in the RAM 1106 and/or storage device 1110 for use by the CPU 1104 during design synthesis, the latter being well known in the computing arts. The processing device 1104 is in communication with the computer memory storage device 1110, and is configured for design implementation of the method for optimizing the architectural model of the microprocessor 1000.

The flowchart and block diagrams in the FIGS. 1-11 illustrate the architecture, functionality, and operation of possible implementations of methods and systems according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention is not limited to the type, number or complexity of peripherals and other circuitry that may be combined using the computer program, method and computing system.

We claim:

1. A tangible non-transitory computer system for optimizing an architectural model of a microprocessor, the computer system comprising:
    a tangible non-transitory computer-readable medium, a computer program being embodied in said computer-readable medium,
    wherein said computer program configures the computer system to execute the steps of:
        representing an instruction set of said microprocessor as a graph by configuring elements of said instruction set as a plurality of nodes of said graph;
        determining whether said plurality of nodes with identical bit position and value encoding is present in said graph;
        when said plurality of nodes with the identical bit position and value encoding is present, separating a path from a source node to a target node into a common node for each node in said graph and reusing the common node to optimize common paths out of said graph;
        directly connecting said source node to the common node in said graph using a forward edge;
        adding a back-edge from the common node to said source node through said target node and recursively repeating the above steps until all the nodes of said graph are processed; and
        creating a new node in said graph when said plurality of nodes with the identical bit position and value encoding is not present in said graph.

2. The computer system as claimed in claim 1, wherein said forward edge is labeled with bit position and value encoding.

3. The computer system as claimed in claim 2, wherein said forward edge is added from a source node to a target node in said graph if the elements corresponding to said source node refers to the elements corresponding to said target node.

4. The computer system as claimed in claim 1, wherein said back-edge is labeled with a Boolean value.

5. The computer system as claimed in claim 1, wherein the elements of said instruction set are instruction groups, instructions and operands.

6. The computer system as claimed in claim 1, wherein the elements represented by said target node is encoded in the elements represented by said source node.

7. The computer system as claimed in claim 1, wherein the elements of said instruction set are defined as a leaf element and non-leaf element.

8. The computer system as claimed in claim 7, wherein said plurality of nodes corresponding to the leaf element contains a comparator that matches input bits with values of said plurality of nodes to set the output to said back-edge.

9. The computer system as claimed in claim 7, wherein said plurality of nodes corresponding to the non-leaf element logically ANDs the values of said back-edge.

* * * * *